(12) United States Patent
Strait

(10) Patent No.: US 6,847,693 B1
(45) Date of Patent: Jan. 25, 2005

(54) METHOD AND DEVICE PROVIDING DATA DERIVED TIMING RECOVERY FOR MULTICARRIER COMMUNICATIONS

(75) Inventor: Jeffrey C. Strait, Nevada City, CA (US)

(73) Assignee: 3Com Corporation, Santa Clara, CA (US)

(*) Notice: Subject to any disclaimer, the term of this patent is extended or adjusted under 35 U.S.C. 154(b) by 0 days.

(21) Appl. No.: 09/573,498

(22) Filed: May 16, 2000

(51) Int. Cl.[7] .............................................. H04L 7/00
(52) U.S. Cl. ...................... 375/355; 375/342; 375/326
(58) Field of Search ................................ 375/355, 342, 375/326, 260, 328, 371, 373, 376

(56) References Cited

U.S. PATENT DOCUMENTS

| | | | | |
|---|---|---|---|---|
| 4,797,635 A | * | 1/1989 | Hatcher | 331/17 |
| 6,310,926 B1 | * | 10/2001 | Tore | 375/355 |
| 6,445,752 B1 | * | 9/2002 | Jiang et al. | 375/326 |
| 6,628,735 B1 | * | 9/2003 | Belotserkovsky et al. | 375/355 |
| 6,628,738 B1 | * | 9/2003 | Peeters et al. | 375/371 |

OTHER PUBLICATIONS

"System Architecture", www.cs.tut.fi/tlt/stuff/adsl/node8.html, printed on Mar. 22, 2000, 2 pages.

* cited by examiner

Primary Examiner—Chieh M. Fan
Assistant Examiner—Kevin Kim
(74) Attorney, Agent, or Firm—McDonnell Boehnen Hulbert & Berghoff LLP

(57) ABSTRACT

A method and a device for providing timing recovery in a multicarrier transmission system is provided. The data derived timing recovery apparatus with the timing error controller adjusts the sampling rate at the receiver. The data derived timing recovery apparatus uses decision directed carrier phase errors to calculate a phase error. The timing error controller adjusts the sampling rate at the receiver in accordance with the phase error.

11 Claims, 5 Drawing Sheets

METHOD AND DEVICE PROVIDING DATA DERIVED TIMING RECOVERY FOR MULTICARRIER COMMUNICATIONS

FIELD OF THE INVENTION

This present invention relates to a method and device for recovering timing information in a multi-carrier communication system.

BACKGROUND OF THE INVENTION

In multi-carrier communications, data may be transmitted over a local twisted-pair telephone line between a central office ("CO") and a residential or business location, commonly referred to as a remote transmitter ("RT"). Data, typically starting as binary information is modulated into a signal, which is sent over a twisted-pair telephone line to a receiver located at the RT. The receiver preferably obtains and samples the signal, whereupon the signal is transformed back into binary information (e.g., a discrete-time signal). At the receiver, accurate timing recovery, commonly consisting of sampling frequency and symbol alignment, is important in order for the receiver to properly extract meaningful binary information from the signal.

Digital Subscriber Line ("DSL") is a transmission technology typically used in multicarrier communications for bringing high bandwidth information to homes and small businesses over ordinary copper telephone lines. Different variations of DSL often referred to as xDSL include asymmetric DSL ("ADSL"), DSL Lite, high bit rate DSL ("HDSL"), rate adaptive DSL ("RADSL"), and very high data rate DSL ("VDSL"). DSL and its variation xDSL preferably provide a customer located at the RT with multicarrier or single carrier technology often tailored for different applications.

Standards have been created for providing accurate timing recovery systems for DSL and xDSL communication systems. For example, in an effort to provide an accurate timing recovery system for asymmetric digital subscriber line ("ADSL") transceivers, the American National Standards Institute ("ANSI") put forth Standard T1.413, the contents of which are incorporated herein by reference, to include standards for timing recovery systems. The ADSL standard specifies a dedicated pilot tone for use in the timing recovery system. The pilot tone, typically embedded in a transmitted signal in ADSL communications, is analyzed to recover timing information used to provide sample frequency and symbol alignment, typically using a variety of available software and hardware techniques.

A disadvantage of a dedicated pilot tone is that typically a carrier is deactivated in order to carry a pilot tone instead of carrying data. By doing this, systems such as narrow band communication systems (e.g., a system having spectral content less than typically found in a broadband system) may waste between 5–10% of the throughput.

Other disadvantages of a dedicated pilot tone may introduce frailties into multicarrier communication systems such as through the use of an unmodulated carrier and perhaps by producing a higher variance of timing error. The single unmodulated carrier used to transmit the pilot tone ordinarily represents a fraction of the received signal power possibly introducing a higher variance of timing error. Furthermore, since the pilot tone is typically sent using an unmodulated carrier (i.e., unmodulated pilot tone signal) temperature, interference, and noise may have more influence on the signal possibly corrupting the pilot signal resulting in an undesirable sampling frequency at the receiver, perhaps leading to lost data and ultimately to a catastrophic receiver failure.

Thus, there is a need to provide robust timing recovery while preferably maintaining available throughput in multicarrier communication systems.

SUMMARY OF THE INVENTION

The system and method for providing timing recovery for use in a multicarrier transceiver preferably utilizes a system wide phase error produced in relation with any or all of the carriers received at the multicarrier transceiver. The system and method for providing timing recovery utilize the system wide phase error to take advantage of the resistance to frailties possibly encountered when using a dedicated pilot tone.

In accordance with an aspect of the present invention a method of determining a sampling frequency in a multicarrier transceiver includes the steps of determining a decision directed carrier phase error for any or all of the carriers received at the multitone receiver, calculating an average symbol offset in accordance with the decision directed carrier phase error, forming a phase error in accordance to the average symbol offset, and adjusting the sampling frequency in response to the phase error.

In accordance with another aspect of the present invention a data derived timing recovery apparatus includes a data derived timing controller and a timing error corrector. The data derived timing controller determines a phase error in accordance to the decision directed carrier phase errors preferably from each loaded carrier. The timing error corrector adjusts a sampling frequency in accordance to the phase error preferably providing timing recovery.

In a preferred embodiment, the timing recovery for use in a multicarrier transceiver is utilized in a digital subscriber line ("DSL") communication system or any variation thereof such as asymmetric DSL ("ADSL"), DSL Lite, High bit rate DSL ("HDSL"), Very high rate The system and method provided herein may utilize an additional carrier (typically deactivated in order to carry a pilot tone) to carry data. By doing this, communication systems may increase available throughput by utilizing more carriers for carrying data.

The system and method provided herein preferably utilizes modulated carriers and calculates a system wide phase error using some or all of the available carriers, thus reducing the variance of timing error. The modulated carriers used to transport data and provide information to calculate a system wide phase error may represent some or all of the received signal power possibly reducing the variance of timing error. Furthermore, since the system wide phase error is calculated from a signal preferably utilizing modulated carriers factors such as temperature, interference, and noise have less influence on the signal thus providing for a robust timing recovery system and method.

The foregoing and other objects, features and advantages of the system and method for providing timing recovery will be apparent from the following more particular description of preferred embodiments of the system and the method as illustrated in the accompanying drawings in which like reference characters refer to the same parts throughout the different views.

BRIEF DESCRIPTION OF THE DRAWINGS

Preferred embodiments of the present inventions are described with reference to the following drawings, wherein.

DETAILED DESCRIPTION OF PREFERRED EMBODIMENTS

The multitone receiver and method have been implemented in a communication system compatible with ADSL transmission protocols, as set forth in ANSI specification T1.413. However, the receiver and method are also well suited for other multicarrier, discrete multi-tone, or orthogonal frequency division modulation ("OFDM") systems.

In a digital transmission system preferably providing ADSL service, a modem at the central office ("CO") is interfaced with a variety of digital services such as telephony, video-on-demand, video conferencing, and the Internet. A transceiver located at the CO referred to as the ADSL transmission unit-central office ("ATU-C") relays the variety of services in the form of data to a transceiver located at a customer's premise such as a home or business location. The transceiver at the customer's premise or remote terminal ("RT") is referred to as the ADSL transmission unit-remote ("ATU-R"). The ATU-R may be connected to a computer or other application device such as a TV, audio equipment, and less intelligent devices (i.e., thermostats, kitchen appliances, etc.). The ATU-C at the CO and the ATU-R at the RT, typically connected together over a phone line, preferably transmit and receive data.

Figure 1:
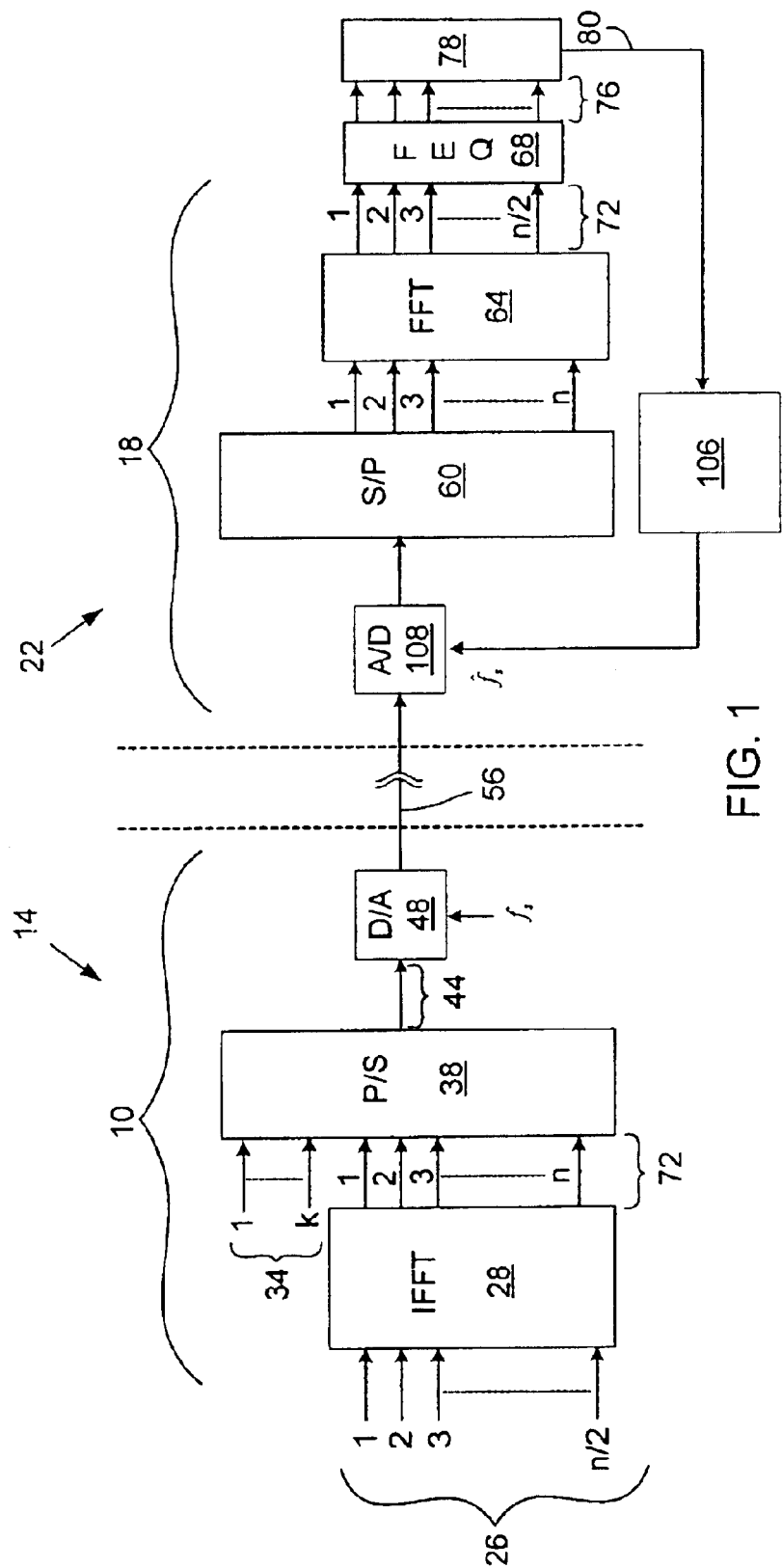
FIG. 1 is a diagram illustrating a transmitter communicating with a receiver utilizing the timing recovery method and device of a preferred embodiment.

FIG. 1 illustrates a transmitter 10 located at the CO 14 transmitting data to a receiver 18 located at the RT 22 utilizing the timing recovery method and device of a preferred embodiment. Initially, the transmitter 10 splits the available communication channels 56 bandwidth into subbands or subchannels. Preferably in each subband a Quadrature Amplitude Modulation ("QAM") carrier is transmitted. Alternative types of modulation include Multiple Phase Shift Keying ("MPSK") including BPSK and QPSK, and Differential Phase Shift Keying ("DPSK"). The data bits are mapped to a series of symbols in the I-Q complex plane, and each symbol is used to modulate the amplitude and phase of the carriers. The symbols are used to specify the magnitude and phase of a subcarrier, where each subcarrier frequency corresponds to the center frequency of "bin" associated with a Discrete Fourier Transform ("DFT"), specified by ADSL standard T1.413.

The modulated time-domain signal corresponding to all of the loaded subcarriers can then be generated in parallel by the use of a well-known DFT algorithm called Inverse Fast Fourier Transform ("IFFT"). The IFFT 28 converts input 26 typically having both a complex and a real part into an output 30 having only a real part. Thus an exemplary 512 point IFFT 28 having 512 outputs 72 (i.e., n=512) consequently has 256 inputs 26 (i.e., n/2=256) into the IFFT 28. From the IFFT 28, the modulated time domain signals and preferably a circular prefix 34 (i.e., an attempt to guarantee orthogonality, described in more detail below) are passed through a parallel to serial converter 38 ("P/S converter") to order the digital data in a serial fashion. The output 44 of the P/S converter 38 is sent to a digital-to-analog (D/A) converter 48 at the rate fs. The digital-to-analog (D/A) converter 48 generates an analog signal from the output 44 of the P/S converter, designated as r(t), that is then transported across the communication channel 56 (e.g., local loop telephone line) to the RT 22.

A circular prefix 34 is made up of a pre-determined number of discrete point's k. Typically the circular prefix 34 is a copy of the pre-determined number of discrete points from the end of a symbol and attaching them to the beginning of the symbol. The symbol with the circular prefix 34 together is referred to as a frame.

The analog signal r(t) is transported over the communication channel 56 to the RT 22. In a preferred embodiment the ATU-R receiver 18 demodulates the signal r(t) at a rate $\hat{f}s$. The rate $\hat{f}s$ is an estimated sampling rate calculated by a data derived timing controller apparatus 106 used by the receiver's 18 A/D converter 108 preferably matching the rate of data sent out of the transmitter 10 at the CO 14. The receiver 18 processes the demodulated signal (i.e., digital samples) by converting the samples from a serial fashion into a parallel fashion as typically performed by a serial to parallel converter 60 ("S/P converter"), removing the cyclic extension 34, and performing an FFT 64 on the remaining samples. A frequency-domain equalizer ("FEQ") 68, as a result of multiplying the FFT outputs 72 with a single complex tap, performs channel equalization. Typically the FEQ 68 adaptively scales each subchannel by the inverse of the channel gain and phase so that a common decision boundary may be used in decoding the data. The resulting output 76 of the FEQ is then passed through a decoder 78 (e.g., a slicer). Information from the decoder 78 is preferably processed by the data derived timing recovery apparatus 106. The data derived timing controller apparatus 106 produces the estimated rate $\hat{f}s$ preferably matching the rate of data sent out of the transmitter 10 at the CO 14. Further processing may be applied to output 80 of the decoder 78 and the application device typically attached to the ATU-R, such as a TV, computer, and other application devices may perform additional processing to the output.

The communication channel 56, like most channels in communication systems has a frequency response. This frequency response is typically described as having an amplitude response and a phase response. Intersymbol interference may occur if the amplitude and phase response are not constant with the frequency band occupied by the transmitted signal r(t), thus the symbols on the same carrier may interfere with other each other causing distortion at the FFT 64 output. To reduce intersymbol interference, a circular prefix 34 is preferably added at the ATU-C transmitter 10. This circular prefix 34 may then perform as a "band" between symbols to attempt orthogonal transmission. Nevertheless, an offset in the sampling frequency at the transmitter 10 and receiver 18 may give rise to a loss of orthogonality between the subcarriers and consequently cause intercarrier interference ("ICI"). According to a preferred embodiment ICI may be reduced since the frequency offset between the sample clock at the transmitter 10 $f_s$ and the sample clock at the receiver 18 $\hat{f}_s$ is preferably small, thus lessening distortion at the FFT outputs 64.

Figure 2:
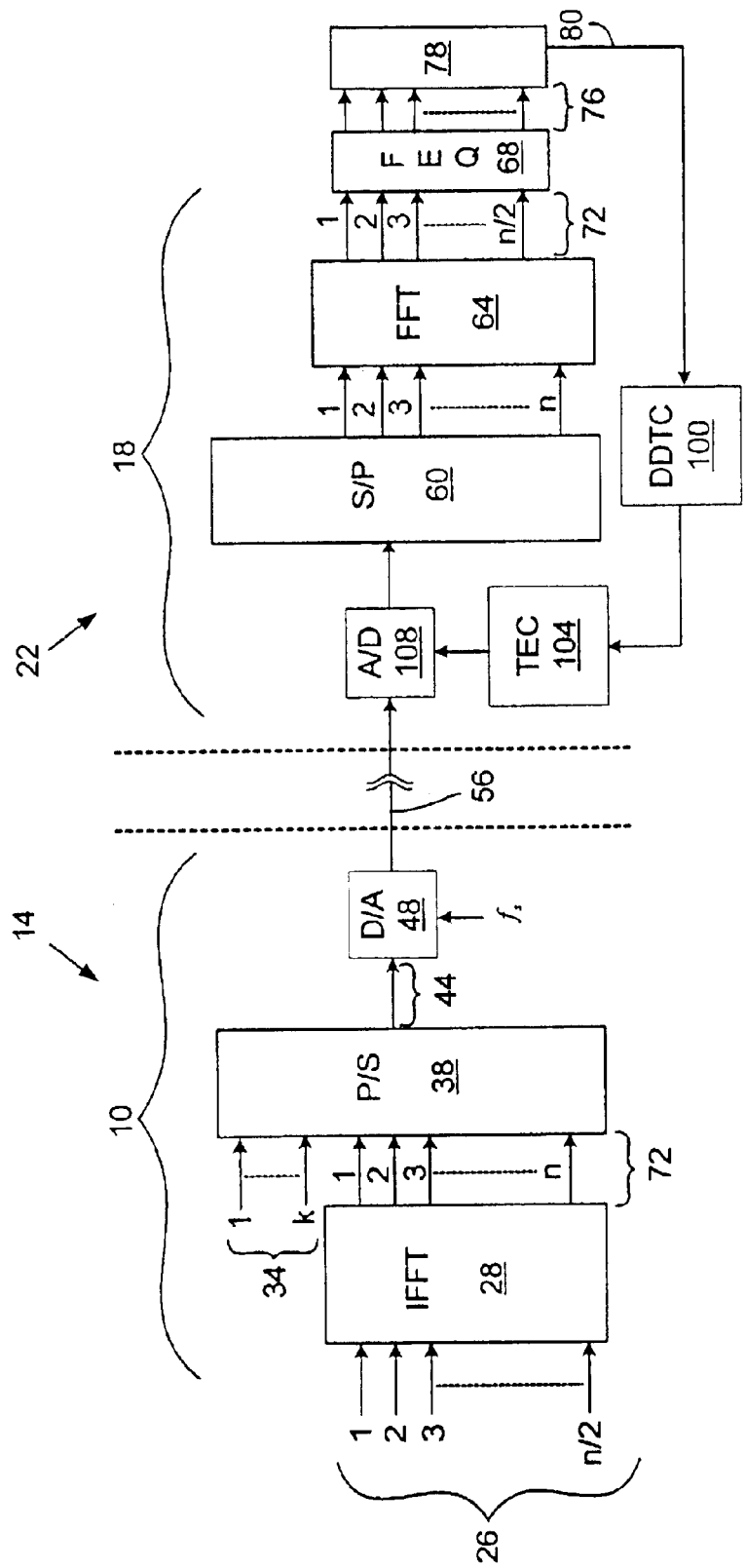
FIG. 2 is a diagram illustrating a communication system utilizing a data derived timing recovery apparatus in accordance with a preferred embodiment.

FIG. 2 shows a diagram of a communication system utilizing a data derived timing recovery apparatus in accordance with the present invention. The data derived recovery apparatus includes a data derived timing controller ("DDTC") 100 and a timing error corrector ("TEC") 104 for adjusting the sampling frequency of the analog to digital converter ("A/D") 108 located at the receiver 18.

The received signal r(t) is sampled by the A/D converter 108. The rate at which the received signal 52 is sampled corresponds to the sampling instants adjusted by the timing error corrector 104. The timing error corrector 104 may use a voltage controlled oscillator ("VCO") to adjust and provide the sampling instants. The VCO modifies the sampling frequency of the A/D and provides feedback through a phase adjustment (e.g., a change in sampling frequency integrated over time) of the received signal relative to the transmitted phase. Thus, the feedback from the VCO provides a reference phase, given as $\phi_r$.

In a preferred embodiment the data derived timing controller 100 uses the feedback, $\phi_r$, from the timing error corrector 104 and the phase of the constellation point in the "mth" bin to calculate a decision directed phase error. The phase of the constellation point, referred to as a carrier phase error, may be found using one of the available techniques known in the art. For example, each frequency bin (i.e., output) of the FFT 64 corresponds to the magnitude and phase of the carrier at the corresponding frequency. Each bin (i.e., the "mth" bin) therefore contains a separate symbol value for each carrier. A frequency domain equalizer ("FEQ") 68 then operates on each of the FFT outputs 72 with a single tap filter to generate the equalized symbol values. The FEQ 68 inverts the residual frequency response of the effective channel by a single complex multiplication. A slicer or a data decision device referred to as a decoder 78 then decodes the FEQ outputs 76. The carrier phase error is thus dependent on a decoder 78, for example, on the slicer decision (not shown). In addition the carrier phase error is preferably calculated using loaded carriers. Loaded carriers are the carriers assigned for data transmission during initialization between the CO 14 and the RT 22.

Figure 3:
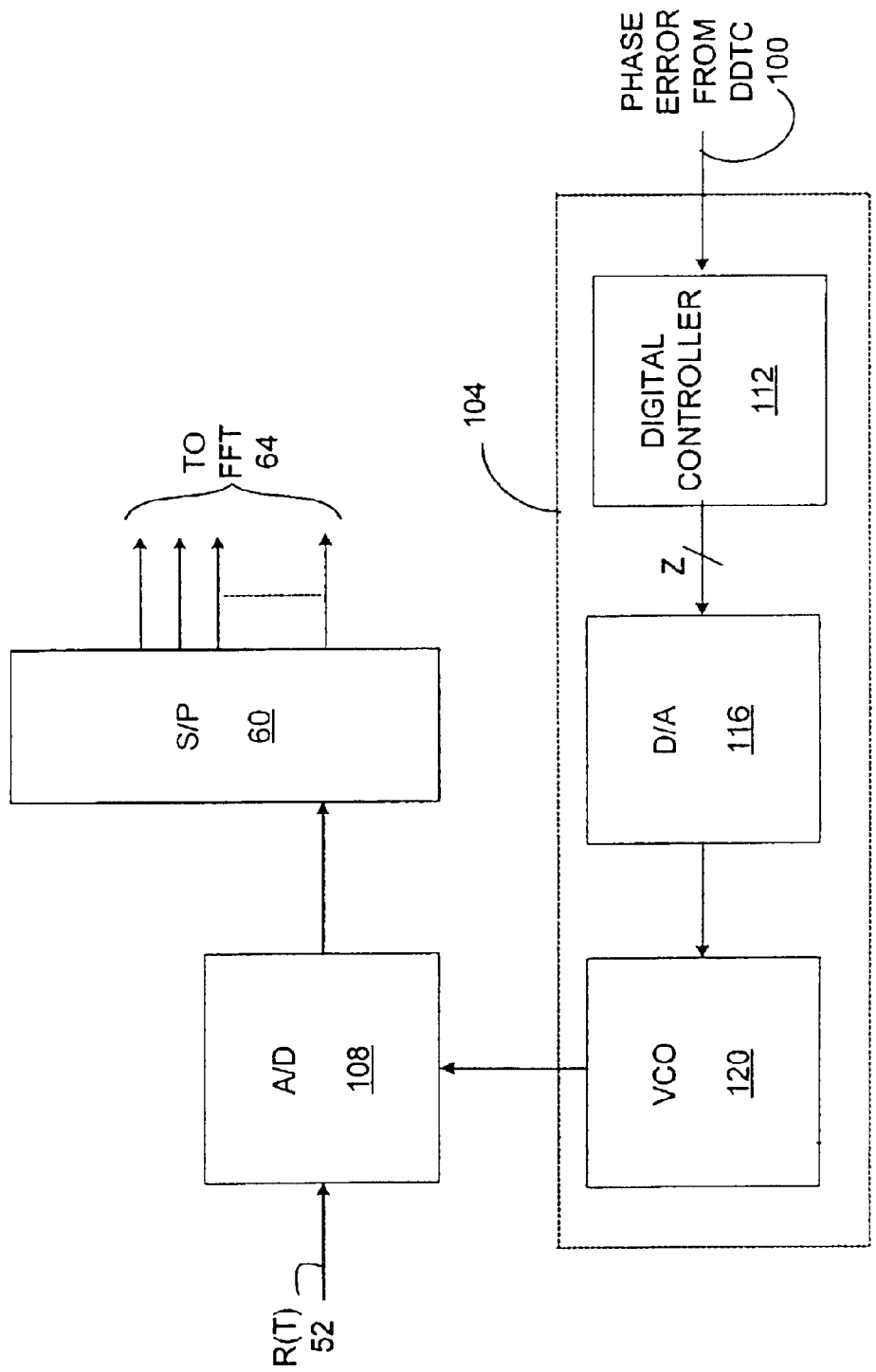
FIG. 3 is a diagram illustrating the timing recovery apparatus of a preferred embodiment.

Referring to FIG. 3 a preferred embodiment of the timing error corrector 104 adjusts the sampling frequency in accordance to the decision directed phase error supplied from the data derived timing controller 100. For instance, the phase error may be used to drive a digital controller 112, which generates a control voltage dependent on the phase error. For example, the digital controller 112 provides a control word often in a binary format (i.e., 1,0,1 . . . ) Z bits in size corresponding to the input phase error. The control voltage is converted from digital to analog form through a D/A 116, which drives a voltage controlled oscillator ("VCO") 120. The VCO 120 modifies the sampling frequency of the receiver's A/D 108, which provides phase adjustment of the received signal 52 relative to the transmitted phase.

In a preferred embodiment the data derived timing recovery apparatus 100 may calculate a decision directed phase error using a method to determine a system wide phase error using a carrier phase error from many individual bins. The number of bins used to calculate the carrier phase errors are preferably adjustable. For example, a carrier phase error may be calculated for each active carrier (each carrier corresponds to a bin) or for a lesser number of the active carriers. Preferably using a suitable number of carriers and consequently bins such that any single carrier phase error or small group of carrier phase errors corresponding to a particular bin or small group of bins will not cause the receiver 18 to fail.

Figure 4:
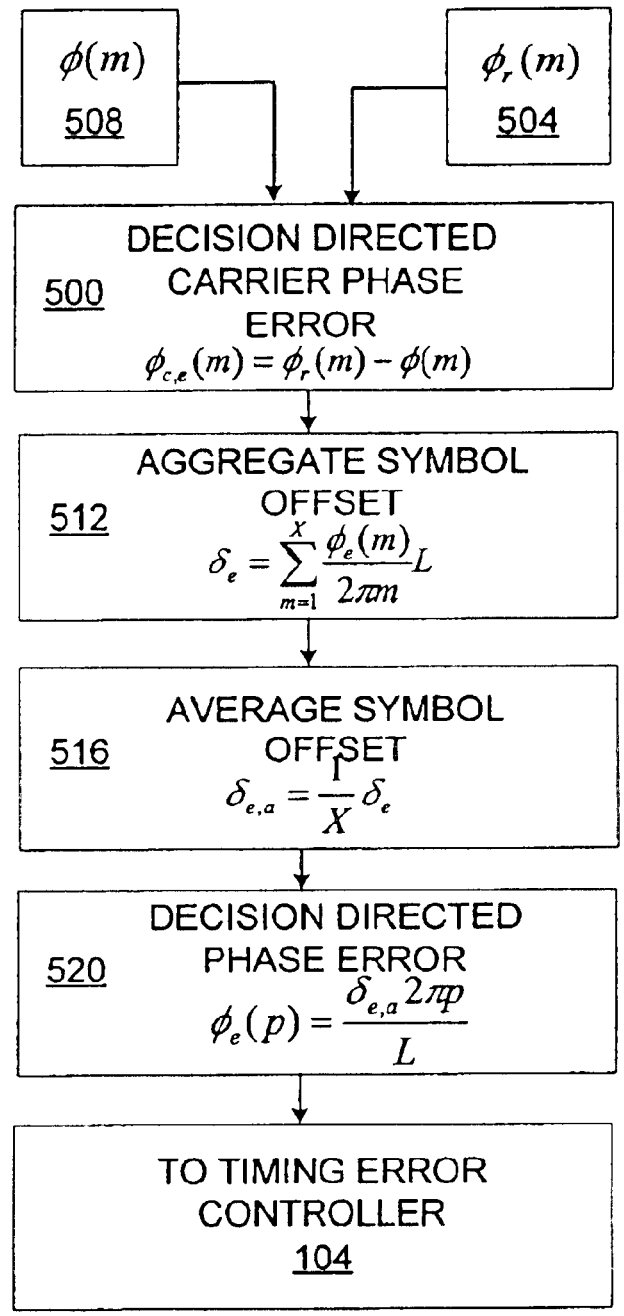
FIG. 4 is a flowchart illustrating a preferred method for determining a decision directed phase error in accordance with each of a plurality of carriers.
Figure 5:
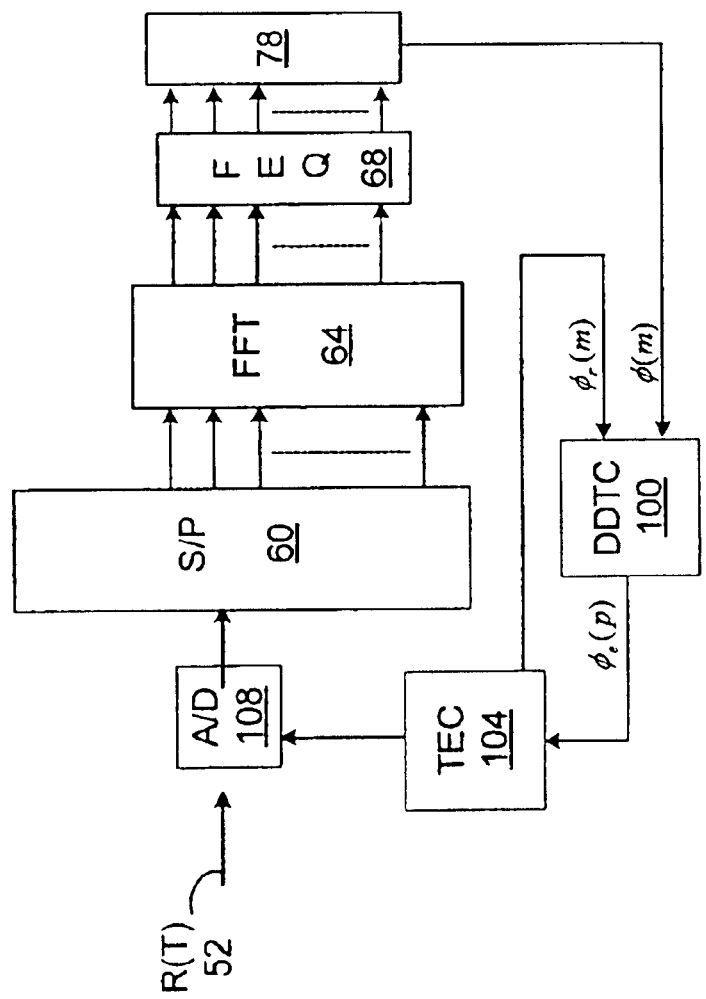
FIG. 5 is a diagram illustrating a receiver of a preferred embodiment.

FIG. 4 is a flowchart illustrating a preferred method for determining a decision directed phase error in accordance with each of a plurality of carriers. Referring to FIG. 5 in relation to FIG. 4, the step of determining a decision directed carrier phase error 500 includes measuring a difference between a reference phase 504 such as found from the feedback provided by the VCO 120 and a carrier phase error 508 such as found in response to a slicer or a decision directed device 78 typically decoding the output bins of the FEQ 68. Thus the step of determining a decision directed carrier phase error 500 is performed in accordance with the relationship: $\phi_{c,e}(m) = \phi_r(m) - \phi(m)$, where $\phi_{c,e}(m)$ is the decision directed carrier phase error for a carrier m, where $\phi_r(m)$ is the reference phase for the carrier m, and where $\phi(m)$ is the decision directed carrier phase for the carrier m.

Each carrier usually contains a different number of sinusoidal periods within a single symbol duration. Typically this difference results in different carrier phase errors with linear dependence on carrier index. To accommodate the differing sinusoidal periods the data derived timing recovery apparatus 100 calculates an average symbol offset in accordance with the decision directed carrier phase error. The step of calculating the average symbol offset preferably includes forming an aggregate symbol offset. The step of forming the aggregate symbol offset 512 is performed in accordance with the relationship:

$$\delta_e = \sum_{m=1}^{X} \frac{\phi_{c,e}(m)}{2\pi m} L,$$

where X is the number of loaded or designated carriers, and where L is the symbol length given in samples. Thus the step of forming the average symbol offset 516 is performed in accordance with the relationship:

$$\delta_{e,a} = \frac{1}{X} \delta_e,$$

where X is the number of loaded carriers, and where L is the symbol length given in samples.

The data derived timing recovery apparatus 100 forms a decision directed phase error relating to the average symbol offset. The step of forming a decision directed phase error 520 includes "denormalizing" the average symbol offset in accordance to a pilot tone frequency such as specified by ADSL standard T1.413. The step of denormalizing the average symbol offset 520 is performed in accordance with the relationship:

$$\phi_e(p) = \frac{\delta_{e,a} 2\pi p}{L},$$

where p is a pilot tone frequency.

The timing error corrector 104 then adjusts the sampling frequency at the A/D 108 in response to the decision directed phase error. Typically, a voltage controlled crystal oscillator in response to the decision directed phase error performs the step of adjusting the sampling frequency.

The system and method may utilize an additional carrier to carry data. By doing this, communication systems may increase available throughput by utilizing more carriers for carrying data.

Other advantages of the system and method are the system wide phase error preferably utilizes modulated carriers and the system wide phase error may be calculated using up to all of the available carriers thus reducing the variance of timing error. The modulated carriers used to transport data and provide information to calculate a system wide phase error may represent some or all of the received signal power possibly reducing the variance of timing error. Furthermore, since the system wide phase error is calculated from a signal preferably utilizing modulated carriers factors such as temperature, interference, and noise have less influence on the signal thus providing for a robust timing recovery system and method.

A preferred embodiment of the present invention has been described herein. It is to be understood, of course, that changes and modifications may be made in the embodiment without departing from the true scope of the present invention, as defined by the appended claims. The present embodiment preferably includes logic to implement the described methods in software motes as a set of computer executable software instructions. The Computer Processing Unit ("CPU") or microprocessor implements the logic that controls the operation of the transceiver. The microprocessor executes software that can be programmed by those of skill in the art to provide the described functionality.

The software can be represented as a sequence of binary bits maintained on a computer readable medium including magnetic disks, optical disks, and any other volatile or (e.g., Random Access memory ("RAM")) non-volatile firmware (e.g., Read Only Memory ("ROM")) storage system readable by the CPU. The memory locations where data bits are maintained also include physical locations that have particular electrical, magnetic, optical, or organic properties corresponding to the stored data bits. The software instructions are executed as data bits by the CPU with a memory system causing a transformation of the electrical signal representation, and the maintenance of data bits at memory locations in the memory system to thereby recon FIG. or otherwise alter the unit's operation. The executable software code may implement, for example, the methods as described above.

It should be understood that the programs, processes, methods and apparatus described herein are not related or limited to any particular type of computer or network apparatus (hardware or software), unless indicated otherwise. Various types of general purpose or specialized computer apparatus may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

It should be understood that a hardware embodiment might take a variety of different forms. The hardware may be implemented as an integrated circuit with custom gate arrays or an application specific integrated circuit ("ASIC"). Of the course, the embodiment may also be implemented with discrete hardware components and circuitry. In particular, it is understood that the filter structures described herein may be implemented in dedicated hardware such as an ASIC, or as program instructions carried out by a microprocessor.

The claims should not be read as limited to the described order of elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

I claim:

1. A method of determining a sampling frequency in a multicarrier transceiver comprising the steps of:

determining a decision directed carrier phase error for each of a plurality of carriers;

calculating an average symbol offset in accordance with the decision directed carrier phase error, wherein the step of calculating the average symbol offset comprises forming an aggregate symbol offset in accordance with the relationship:

$$\delta_e = \sum_{m=1}^{X} \frac{\phi_{c,e}(m)}{2\pi m} L,$$

where X is the number of loaded carriers, where L is the symbol length given in samples and where $\emptyset_{c,e}$ (m)=$\emptyset_r$ (m)-$\emptyset$(m), where $\emptyset_{c,e}$ (m) is the decision directed carrier phase error for a carrier m, $\emptyset_r$ (m) is the reference phase for the carrier m, and $\emptyset$(m) is the carrier phase for the carrier m;

forming a decision directed phase error relating to the average symbol offset; and adjusting the sampling frequency in response to the decision directed phase error.

2. The method of claim 1, wherein the plurality of carriers comprises a received multitone signal.

3. The method of claim 1, wherein the step of determining a decision directed carrier phase error includes measuring a difference between a reference phase and a carrier phase.

4. The method of claim 3, wherein the reference phase is found in response to a slicer.

5. The method of claim 1 wherein the step of forming the average symbol offset is performed in accordance with the relationship:

$$\delta_{e,a} = \frac{1}{X}\delta_e,$$

where X is the number of loaded carriers.

6. The method of claim 1, wherein the step of forming a decision directed phase error includes denormalizing the average symbol offset in accordance to a pilot tone frequency.

7. The method of claim 6 wherein the step of denormalizing the average symbol offset is performed in accordance with the relationship:

$$\phi_e(p) = \frac{\delta_{e,a} 2\pi p}{L},$$

where p is a pilot tone frequency and $\delta_{e,a}$ is the average symbol offset.

8. The method of claim 1, wherein the step of adjusting the sampling frequency is performed by a voltage controlled oscillator in response to the decision directed carrier phase error.

9. A data derived timing recovery apparatus for use in a multicarrier transceiver comprising:

a data derived timing controller, wherein the data derived timing controller determines a decision directed phase error, wherein the decision directed phase error is determined in response to a decision directed carrier phase error for each of a plurality of loaded carriers by a method comprising:

determining a decision directed carrier phase error for each of a plurality of carriers;

calculating an average symbol offset in accordance with the decision directed carrier phase error, wherein the step of calculating the average symbol offset comprises forming an aggregate symbol offset in accordance with the relationship:

$$\delta_e = \sum_{m=1}^{X} \frac{\phi_{c,e}(m)}{2\pi m} L,$$

where X is the number of loaded carriers, where L is the symbol length given in samples and where $\emptyset_{c,e}(m) = \emptyset_r(m) - \emptyset(m)$, where $\emptyset_{c,e}(m)$ is the decision directed carrier phase error for a carrier m, $\emptyset_r(m)$ is the reference phase for the carrier m, and $\emptyset(m)$ is the carrier phase for the carrier m;

forming a decision directed phase error relating to the average symbol offset; and a timing error corrector, wherein the timing error corrector adjusts a sampling frequency in accordance to the decision directed phase error.

10. The device in claim 9, wherein the timing error corrector is a voltage controlled oscillator.

11. A machine-readable storage medium containing a set of instructions for determining a sampling frequency in a multicarrier transceiver following steps:

determining a decision directed carrier phase error for each of a plurality of carriers;

calculating an average symbol offset in accordance with the decision directed carrier phase error, wherein the step of calculating the average symbol offset comprises forming an aggregate symbol offset in accordance with the relationship:

$$\delta_e = \sum_{m=1}^{X} \frac{\phi_{c,e}(m)}{2\pi m} L,$$

where X is the number of loaded carriers, where L is the symbol length given in samples and where $\emptyset_{c,e}(m) = \emptyset_r(m) - \emptyset(m)$, where $\emptyset_{c,e}(m)$ is the decision directed carrier phase error for a carrier m, $\emptyset_r(m)$ is the reference phase for the carrier m, and $\emptyset(m)$ is the carrier phase for the carrier m;

forming a decision directed phase error relating to the average symbol offset; and adjusting the sampling frequency in response to the decision directed phase error.

* * * * *